United States Patent
Ling et al.

(10) Patent No.: US 7,435,300 B2
(45) Date of Patent: Oct. 14, 2008

(54) DYNAMIC FILM THICKNESS CONTROL SYSTEM/METHOD AND ITS UTILIZATION

(75) Inventors: Kow-Je Ling, Taipei (TW); Jiunn-Shiuh Juang, Chiai (TW)

(73) Assignee: Hermosa Thin Film Co., Ltd., Taipei (TW)

( * ) Notice: Subject to any disclaimer, the term of this patent is extended or adjusted under 35 U.S.C. 154(b) by 0 days.

(21) Appl. No.: 10/277,677

(22) Filed: Oct. 23, 2002

(65) Prior Publication Data

US 2008/0216741 A1 Sep. 11, 2008

(30) Foreign Application Priority Data

Oct. 26, 2001 (TW) ............... 90126544 A

(51) Int. Cl.
*H01L 21/00* (2006.01)
*C23C 16/00* (2006.01)
*C23C 14/00* (2006.01)

(52) U.S. Cl. ............ 118/720; 118/721; 118/726; 118/712; 204/192.1; 204/298.01

(58) Field of Classification Search ......... 118/726, 118/720, 721, 723 VE, 723 CB, 723 EB; 156/345.3
See application file for complete search history.

(56) References Cited

U.S. PATENT DOCUMENTS

| | | | | |
|---|---|---|---|---|
| 3,892,490 A * | 7/1975 | Uetsuki et al. | ...... | 356/388 |
| 4,068,016 A * | 1/1978 | Wilmanns | ...... | 427/10 |
| 4,793,908 A * | 12/1988 | Scott et al. | ...... | 204/192.26 |
| 4,923,585 A * | 5/1990 | Krauss et al. | ...... | 204/298.04 |
| 5,113,787 A * | 5/1992 | Tomita et al. | ...... | 118/400 |
| 6,027,631 A * | 2/2000 | Broadbent | ...... | 205/137 |
| 6,063,436 A * | 5/2000 | Pavell et al. | ...... | 427/162 |
| 6,402,905 B1 * | 6/2002 | Baldwin et al. | ...... | 204/192.13 |
| 2002/0139666 A1 * | 10/2002 | Hsueh et al. | ...... | 204/298.03 |

* cited by examiner

*Primary Examiner*—Ram N. Kackar
(74) *Attorney, Agent, or Firm*—Troxell Law Office, PLLC

(57) ABSTRACT

A dynamic film thickness control system/method and its utilization consisting of a minimum of one mask plate arranged between a substrate and a vapor source. A film thickness control device is utilized for real-time control over deposited film thickness and gradually moves the mask plate according to the film thickness control value acquired by the film thickness control device, enabling the mask plate to mask film zones on the said substrate to achieve the film thickness of a design objective. When the required zones of deposition are masked, the deposition of a particular film layer is completed.

2 Claims, 17 Drawing Sheets

(a)   (b)

DYNAMIC FILM THICKNESS CONTROL SYSTEM/METHOD AND ITS UTILIZATION

BACKGROUND OF THE INVENTION

1) Field of the Invention

The invention herein relates to film thickness control in coating systems, specifically a dynamic film thickness control system/method and its utilization.

2) Description of the Prior Art

Due to significant technological progress in recent years, the requirements of uniform film thickness have become considerably stringent. For example, the film currently utilized on aircraft cockpits to reflect electromagnetic waves is a single layer transparent, conductive oxide film such as indium-tin oxide or indium-zinc oxide film. The precision requirements of which are not great; however, these will be further improved into higher precision multi-layer optical films in the future as technology advances.

Referring to FIG. 1, an example conventional coating system is comprised of an optical thickness monitoring light source assembly 1 (referred to hereafter as the light source), an optical control test glass 2 (referred to hereafter as the test glass), an optical control detector 3 (referred to hereafter as the detector), a first window 4, a second window 5, a third window 6, a substrate placement fixture 7, a substrate 8 to be coated, a quartz crystal and its placement fixture 9 (referred to hereafter as the quartz crystal), and a vapor source 10, wherein the light ray path is composed of a projected ray 11, a penetrating ray 12, and a reflected ray 13; the coating material evaporated from the vapor source 10 deposits to surface of the substrate 8, while also depositing to the surfaces of the optical test glass 2 and the quartz crystal 9; the detector 3 ascertains the changing in the penetrating ratio and/or the reflection ratio to control film thickness and the quartz crystal 9 ascertains changing in oscillating frequency to control film thickness; and the said optical test glass 2 and the quartz crystal 9 are situated at the center of the substrate placement fixture 7. Conventional film thickness control can be by means of optical control or quartz crystal control, or both, with the said optical control device comprised of a light source, a detector, and an optical test glass. To enable uniform film thickness, the said substrate plate placement fixture 7 can be rotated around its own axis (as indicated in FIG. 2) or set into planetary rotation (as indicated in FIG. 3).

When it is set into planetary rotation, the substrate placement fixture 7 not only rotates around the axis of the coating system, but also around its own axis.

Adjusting the height of the film thickness control test glass (the optical test glass 2 and/or the quartz crystal 9) and the height of the substrate placement fixture 7 enables the film thickness of the test glass and the film thickness of the substrate to be of a specific proportion to thereby provide for real-time control over the thickness of the deposited film during the evaporating process. The said evaporating method is suitable for utilization in optical film designs in which the thickness error requirements are not especially great such as anti-reflection films, highly reflective films, and various ordinary spectroscopic films. However, in the case of optical film designs having extremely high precision thickness error requirements (for example, the narrow band filter for optical fiber communications-use, having a total of about 100 layers, with each layer having an error tolerance of 0.003 percent), its suitability is extremely problematic. Furthermore, if the said substrate is very large in dimension, (for example, two to three meters), utilizing the said coating method would require an extremely large vacuum system and incur production difficulties.

The U.S. Pat. No. 5,156,727 (Film Thickness Uniformity Control Apparatus for In-line Sputtering Systems) discloses a design in which a mask plate of variable shape controls film thickness such that following the completion of sputtering, then externally measures the thickness of the film deposited on the substrate and alters the shape of the mask plate to correct subsequent sputtering thickness uniformity based on the measurement results. This method of correcting sputtering thickness uniformity afterwards by changing mask plate shape after sputtering completion is incapable of immediately effecting accurate correction during the sputtering process which, with regard to relatively more complex or high precision requirement optical film designs, would still have production difficulties.

The invention herein is submitted to improve current coating technology by reducing coating thickness errors in optical film designs.

SUMMARY OF THE INVENTION

The primary objective of the invention herein is to provide a dynamic film thickness control system and method that utilizes one or more points of simultaneous control, a correspondingly movable control system, and a matching mask plate control to effectively afford control over accurate coating uniformity and thickness.

Another objective of the invention herein is to provide a dynamic film thickness control system and coating method that utilizes one or more points of simultaneous control, a correspondingly movable control system, and a matching mask plate control to effectively afford control over accurate coating uniformity and thickness, and thereby achieve optimal film quality.

Other objectives, functions, and embodiments of the present invention are elaborated in the brief description of the drawings below and followed by the detailed description of the invention herein.

DETAILED DESCRIPTION OF THE INVENTION

Figure 1:
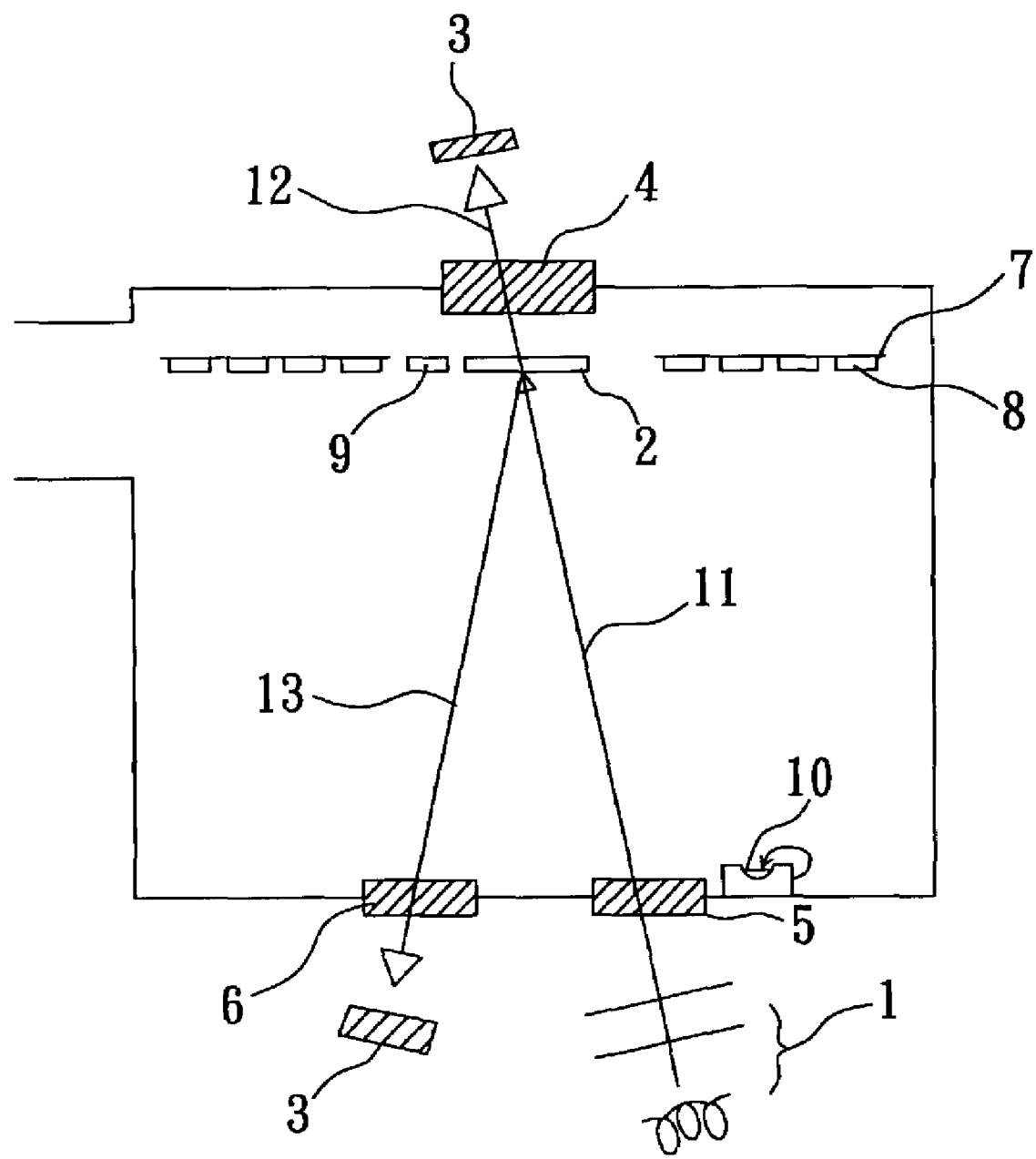
FIG. 1 is a cross-sectional drawing of the conventional coating system.
Figure 2:
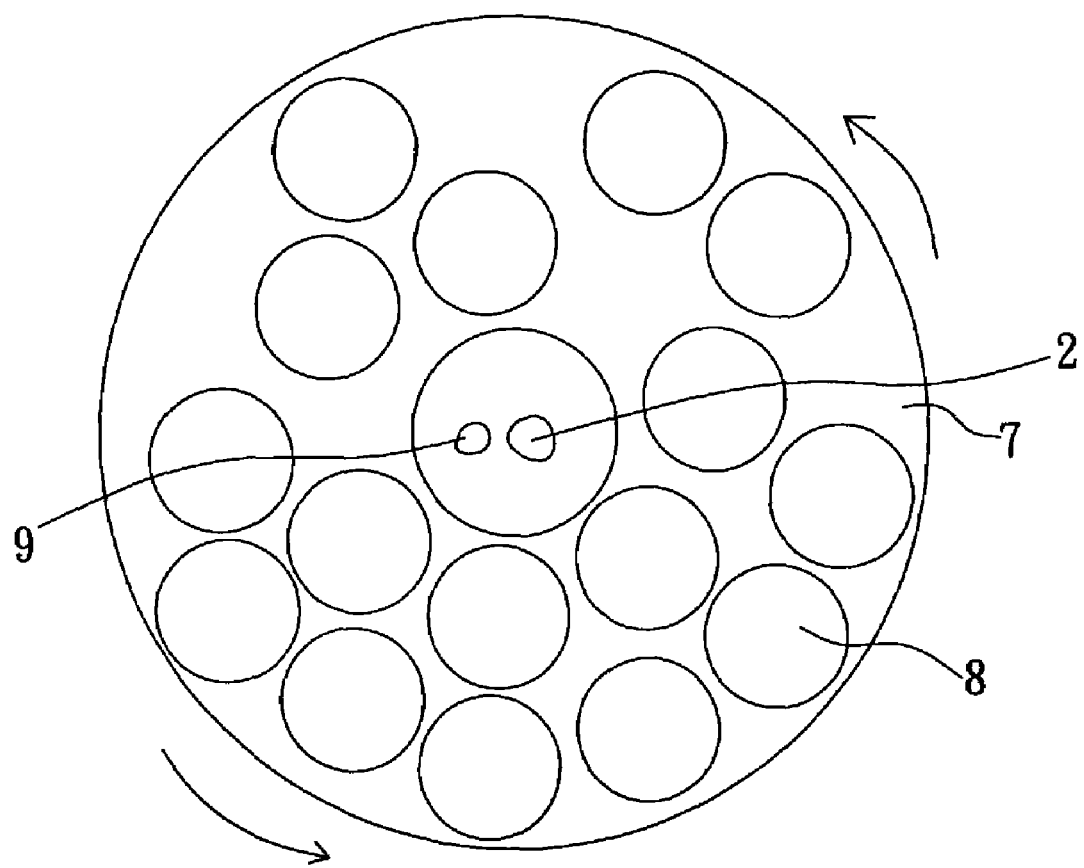
FIG. 2 is an orthographic drawing of the revolving substrate of the conventional coating system.
Figure 3:
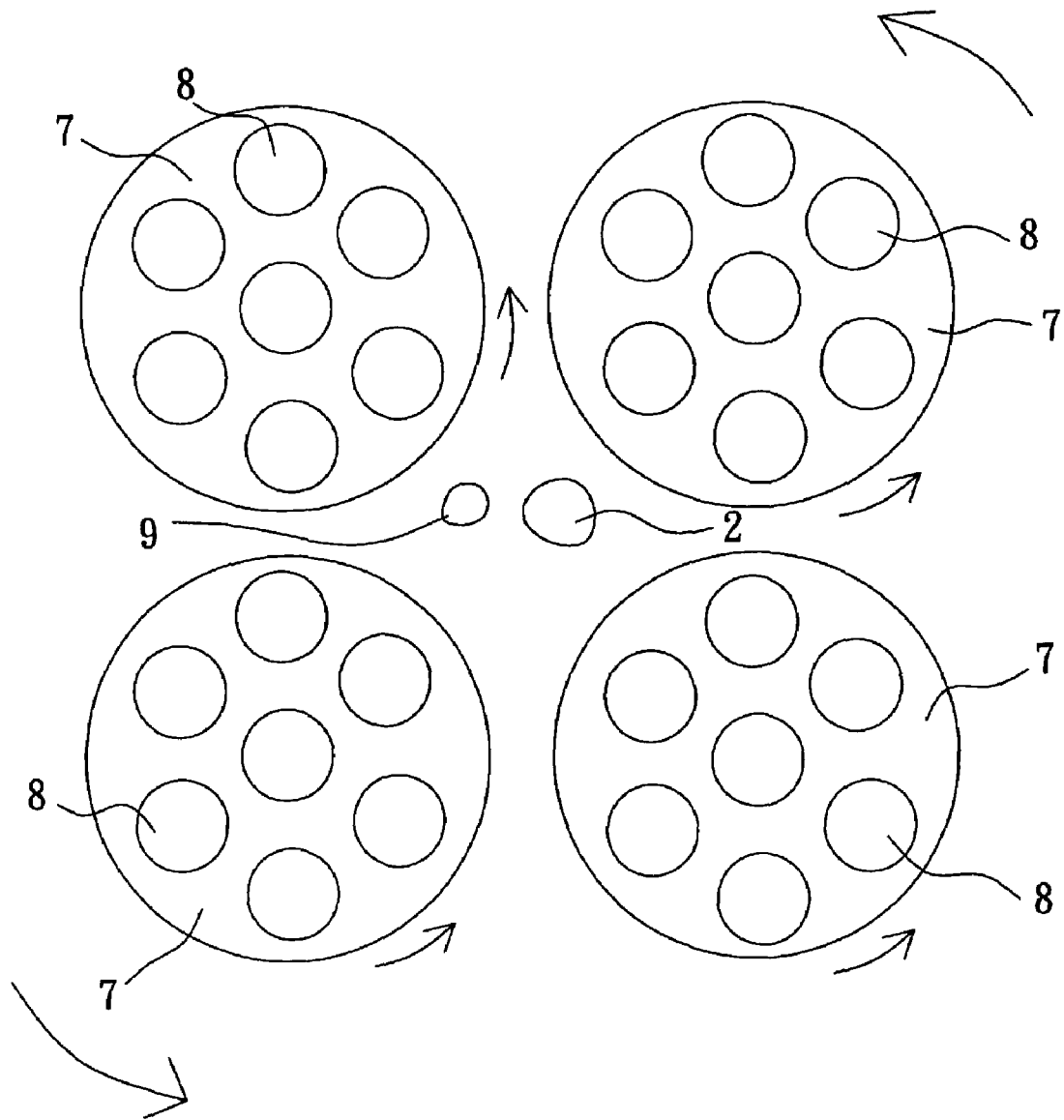
FIG. 3 is an orthographic drawing of the substrate of the conventional coating system in planetary rotation.

The film thickness control principles of the invention herein are explained below. Theoretically, if a thickness monitoring device is disposed at different positions of every unit of surface area on a substrate and, furthermore, there is a skillfully designed mask plate device, when the film thickness at certain positions on the substrate reaches the design objective during the coating process, then be masked by the mask plate. After every position on the substrate is covered by the mask plate, the thickness of each position on the substrate is at the design objective film thickness and unlike the said conventional coating system, it is not necessary to rotate the substrate to enable uniform film thickness. However, the design of the mask plate system is difficult and, furthermore, the disposing of so many thickness control devices at different substrate positions is also quite problematic. Additionally, in a conventional vacuum coating system, the film material must be converted utilizing a physical or chemical method into a gaseous state for deposition in the system. However, if amply utilizing metal bellows as well as the appropriate protection or utilizing a powerful magnetic field to control the flow direction of the ionized gas and an adequate external drive, then the vapor source's position and flow direction of the coating material molecules can have a three-dimensional movement and rotation. The relative positions of substrate and vapor source are then suitably arranged such that the film thickness is changed monoclinally from zone to zone. One or more mask plates are arranged to commence the masking of film zones, with the arrangement and shape of the mask plates determined by the actual distributed extent of the film and the coating system. Here, the so-called film thickness control can be a quartz crystal control, an optical single wavelength control, an optical multiple wavelength control, or an optical full wavelength control. During the evaporating process, when it is detected that the film thickness has reached the objective thickness, the mask plates are placed over the zones where the film thickness is at the objective thickness, while the film thickness control system is moved to the next zone and so on until the entire substrate plate is masked, thereby completing the coating of the film. Virtually unlimited, coating methods include ionic assisted or non-ionic assisted electronic gun evaporating and thermal-resistance evaporation, cathodic arc plasma deposition, anodic plasma deposition, and other physical vapor deposition methods as well as thermal chemical vapor deposition (thermal CVD), metal organic chemical vapor deposition (MOCVD), and plasma enhanced chemical vapor deposition (PECVD). The substrate can be rotatable, movable, or static. The vapor source be single, multiple, or a combination of different types. Furthermore, the vapor source can be static, movable or, depending on the design of different coating systems, moved a certain specific direction as well as moved or rotated upward, downward, leftward, and rightward to achieve optimal film quality.

Figure 4:
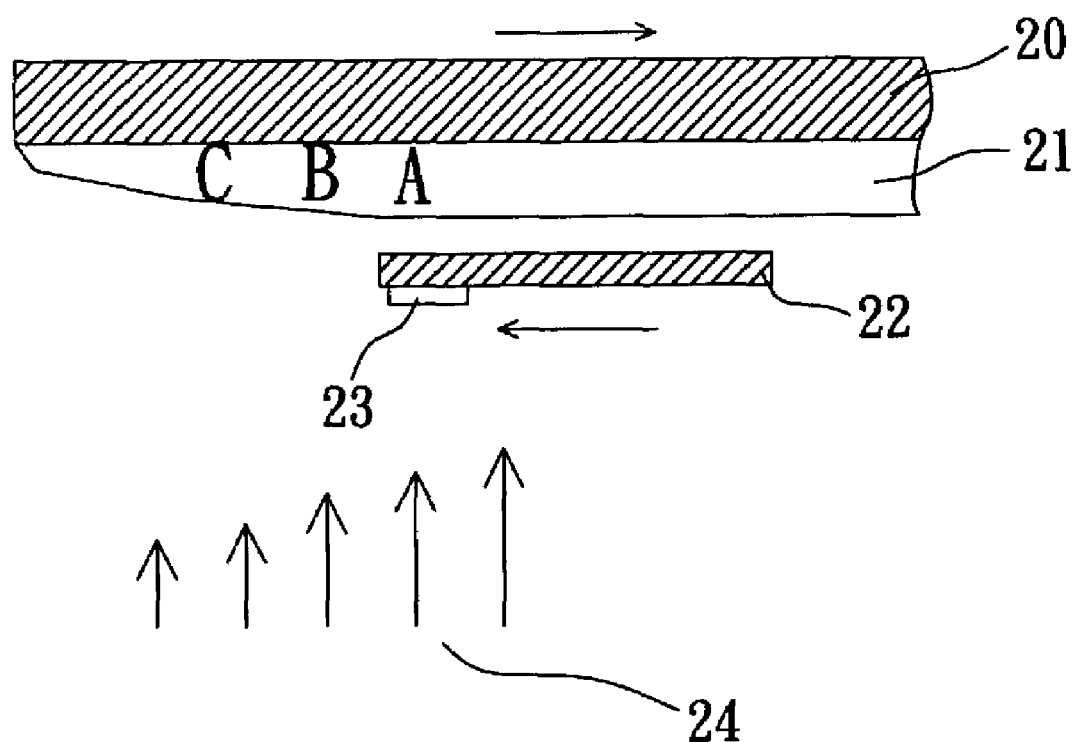
FIG. 4 is a cross-sectional drawing of the first embodiment of the invention herein.

The first embodiment of the dynamic film thickness control system of the invention herein, as indicated in FIG. 4, consists of a mask plate 22 situated at the lower extent of a substrate 20 and a quartz crystal 23 attached to bottom surface at the end of the said mask plate 22. The thickness of the film 21 deposited onto the substrate 20 is exaggerated in the drawing for purposes of clarity, wherein the arrows 24 indicate the average coating speed rate, the shorter or longer lengths of the arrows 24 representing slower and faster coating speed rates; the evaporation source is not shown in figure. The embodiment herein places the quartz crystal 23 at an appropriate position at the lower extent of the mask plate 22. Prior to coating, the relative thickness of the film 21 on each zone of the substrate 20 can be ascertained by a computer-simulated calculation or actual measurement when the mask plate 22 in not in place. During the actual coating thereafter, the mask plate 22 is moved towards the slower extent (the left side in FIG. 4) of coating speed rate and when the deposited film 21 is monitored by the quartz crystal 23 control, reaches the required thickness—at point A, for example, the mask plate 22 is moved to the left to mask point A such that there is no further contact with the vaporized coating material. Since the relative thickness differences of the deposited film 21 between points A, B, and C before mask plate 22 placement is known in advance, therefore, after the known required thickness is reached at point A, additional thickness must be deposited at point B in order to reach the required thickness can be calculated. As the quartz crystal 23 continues detection at the position of the masked point A, when it acquires a thickness equal to the additionally deposited value desired at point B, the mask plate 22 moves towards the left side to mask point B; if the increased coating thickness value acquired is still too small, the mask plate 22 moves towards the right side to increase the coating speed rate. As such, when the film 21 deposited on the substrate 20 reaches the required thickness, the substrate 20 is masked, thereby completing the substrate 20 coating operation. In the embodiment herein, the substrate 20 can be movable or static in accordance with different vacuum coating system designs; the vapor source can be single, multiple, or a combination of different types and, furthermore, depending on the design of different vacuum coating systems, static or capable of three-dimensional movement or rotation, to achieve optimal deposited film quality.

Figure 5:
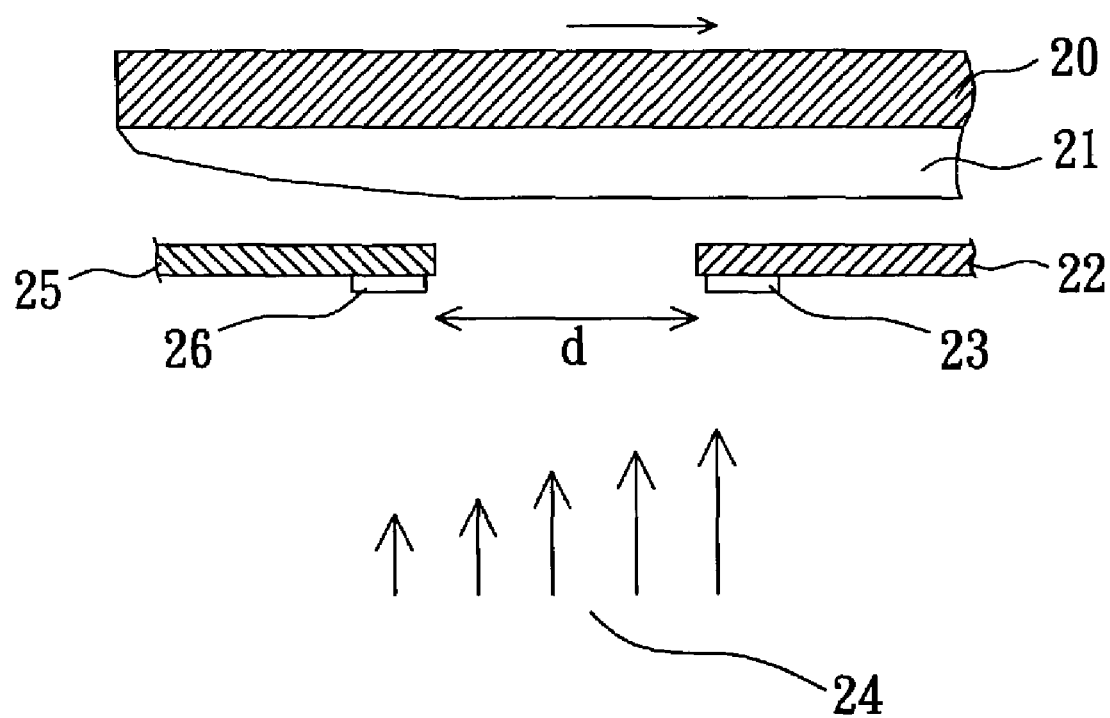
FIG. 5 is a cross-sectional drawing of the second embodiment of the invention herein.

Furthermore, although some coating systems such as cathodic arc plasma deposition having magnetic fields that directionally ions to eliminate large particles or anodic plasma deposition that produce large volumes of plasma have numerous advantages, but the film thickness is difficult to control. The second embodiment of the invention herein solves the said problem and, as indicated in FIG. 5, consists of a second mask plate 25 and a second quartz crystal 26 at one side of a first mask plate 22 in FIG. 4. As such, the first quartz crystal 23 and the second quartz crystal 26 are at two positions of coating speed rate, with the movable first mask plate 22 and second mask plate 25 governing the distance d between the two positions to thereby control the thickness of the film 21 deposited on the substrate 20. If this control system is utilized in a continuous coating system, since the first and second quartz crystals 23 and 26 lose accuracy when coating is excessively thick, a movable cover plate, cover, or screen is positioned over the first and second quartz crystals 23 and 26 to extend their service life. In the embodiment herein, the substrate 20 can be movable or static in accordance with different vacuum coating system designs; the vapor sources can be single, multiple, or a combination of different types and, furthermore, depending on the design of different vacuum coating systems, static or capable of three-dimensional movement or rotation to achieve optimal deposited film quality.

Figure 6:
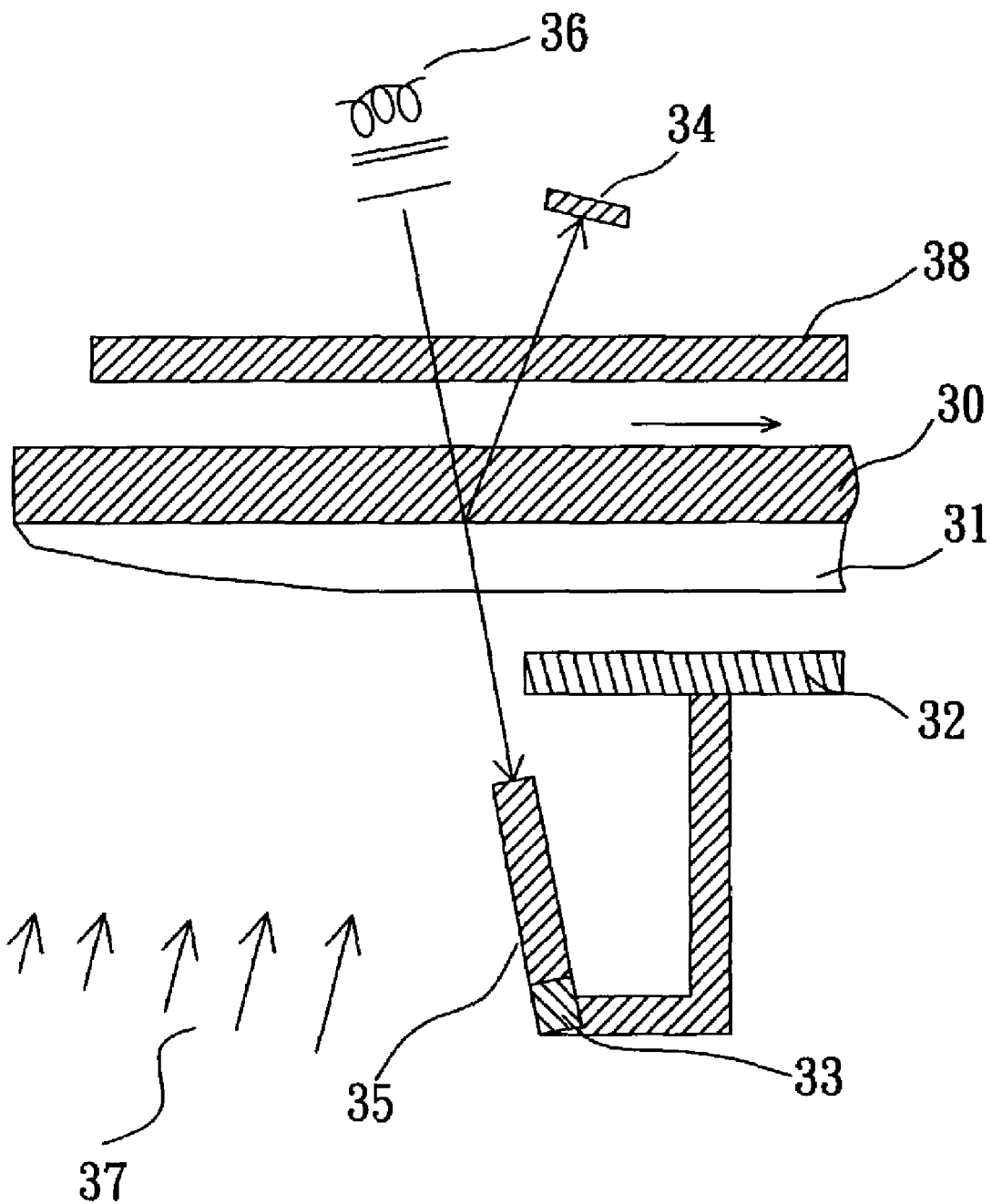
FIG. 6 is a cross-sectional drawing of the third embodiment of the invention herein.

If the deposition of a higher precision optical film is needed, the invention herein provides a third embodiment control system which, as indicated in FIG. 6, consists of a mask plate 32 situated at the lower extent of a substrate 30; a first detector 33 is utilized to measure light rays penetrating through the substrate 30 and film 31, with a second detector 34 measuring the light rays reflected from the substrate 30; the long and short arrows 37 indicate the rapidity and slowness of the coating speed rate and the vapor source is not shown in the drawing. The light source 36 of the control system embodiment herein is separately situated at a window 38 outside the vacuum system, enabling the light rays of the light source 36 to be externally projected through the window 38 and the transparent substrate 30 for the execution of optical control, without requiring the additional installation of an optical test piece. The said second sensor 34 is situated outside the vacuum system and the first detector 33 is attached to the lower extent of the mask plate 32 inside the vacuum system; to protect the first detector 33 from deposition, a small tube 35 is conjoined to the front extremity of the first detector 33 and, if the small tube 35 is of sufficient narrowness and length, most of the coating material entering the tube opening clings to the inner wall of the small tube 35 and does not adhere to the surface of the first detector 33 and, thus, has no effect on detection performance. The placement of the first detector 33 within the vacuum system is more expedient, but there are focusing drawbacks; if actual conditions permit, the detector 33 can be placed outside the vacuum system, as indicated in FIG. 1, such that the light rays are directed through the window 38 onto the detector 33. The said detector can utilize optical fiber as a replacement light ray guide for detection purposes. In the embodiment herein, the substrate 30 can be movable or static in accordance with different vacuum coating system designs; the vapor source can be single, multiple, or a combination of different types and, furthermore, depending on the design of different vacuum coating systems, static or capable of three-dimensional movement or rotation, to achieve optimal deposited film quality.

Figure 7:
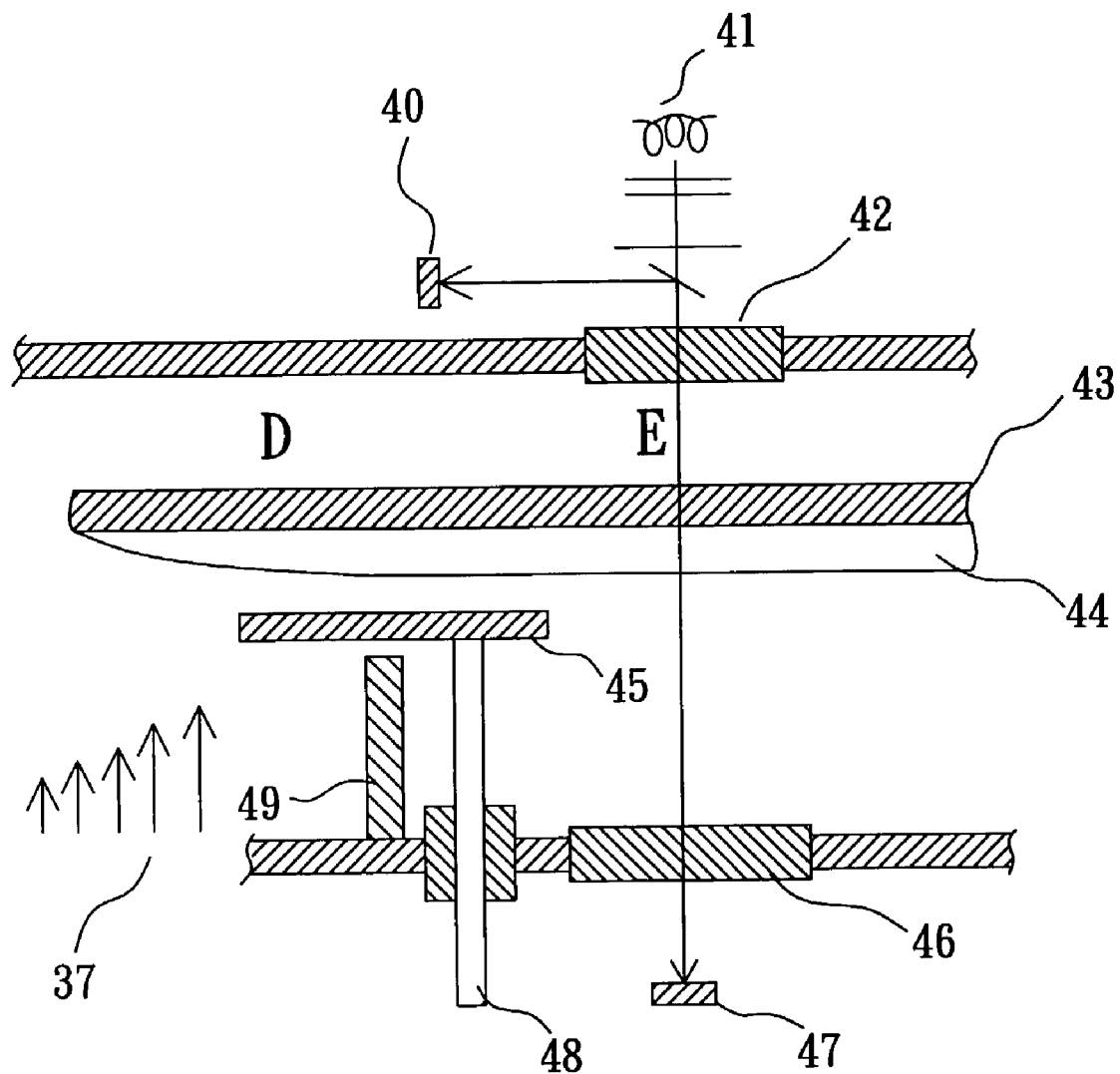
FIG. 7 is a cross-sectional drawing of the fourth embodiment of the invention herein.

Referring to FIG. 7, the fourth embodiment of the invention herein is suitable for continuous coating systems and consists of an optical control device positioned apart from the vapor source, wherein an light source 41 projects light rays through a first window 42, a substrate 43, a film 44, and a second window 46 onto a first detector 47, with another portion of the light rays reflected to a second detector 40; a mask plate 45 is situated between the vapor source and the substrate 43, a connecting rod 48 controls the mask plate 45 forward and backward, and a separator plate 49 isolates the coating material to prevent contamination of the optical control device. The substrate 43 of the embodiment herein is in continuous motion and since the substrate 43 moves towards the right without interruption, when the optical control device detects that the film is of excessive thickness, the connecting rod 48 moves the mask plate 45 towards the left or, conversely, towards the right and, as such, enables the correct thickness of the film 44 on the substrate 43. In the embodiment herein, the substrate 43 is movable; the vapor source can be single, multiple, or a combination of different types and, furthermore, depending on the design of different vacuum coating systems, static or capable of three-dimensional movement or rotation to achieve optimal deposited film quality.

Figure 8:
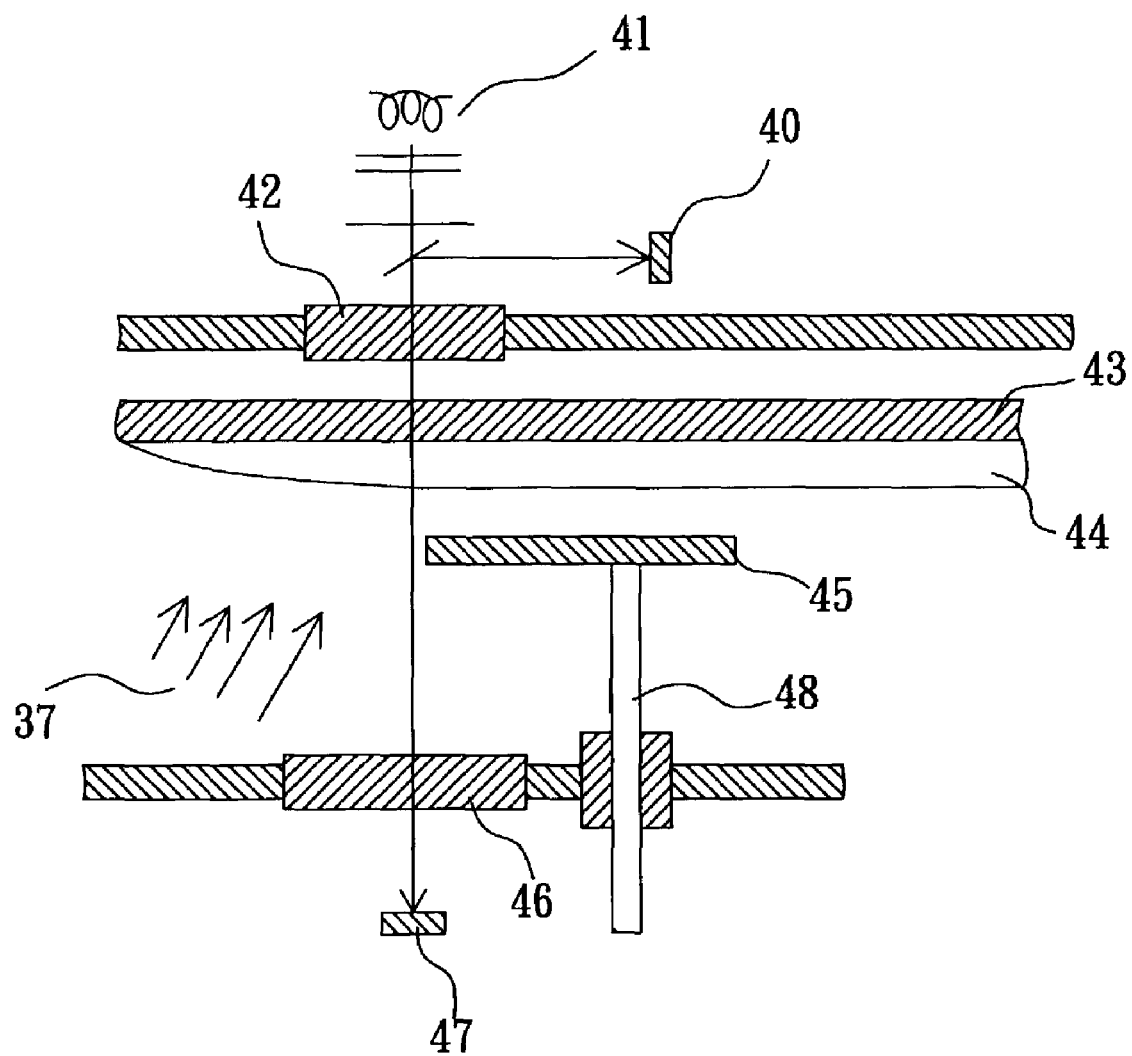
FIG. 8 is a cross-sectional drawing of the fifth embodiment of the invention herein.

However, the control system disclosed by the said fourth embodiment of the invention herein has a drawback; as indicated in FIG. 7, when the deposition of the film 44 at position D is completed, movement to position E is required in order to detect its thickness and there is a time differential; if the control position is moved to the anterior extent of the mask plate 45, as indicated in FIG. 8, the disclosure of the fifth embodiment of the invention herein, the said light source 41, the first window 42, the second window 46, and the first detector 47 are situated at the anterior extent of the mask plate 45 and the said drawback is no longer present, but such an arrangement is more difficult. In the embodiment herein, the substrate 43 is movable; the vapor source can be single, multiple, or a combination of different types and, furthermore, depending on the design of different vacuum coating system, static or capable of three-dimensional movement or rotation to achieve optimal deposited film quality.

Figure 9:
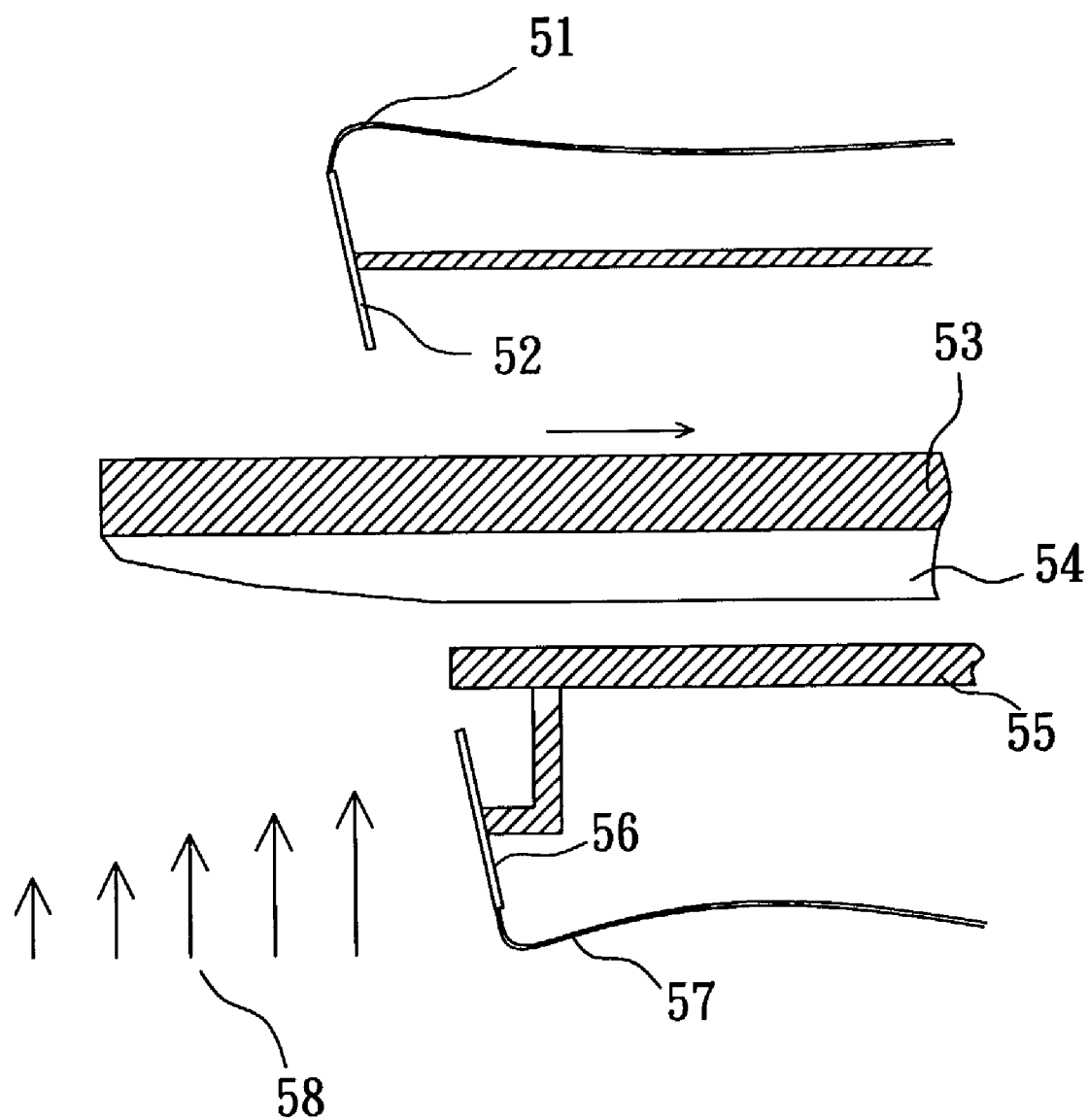
FIG. 9 is a cross-sectional drawing of the sixth embodiment of the invention herein.

If a coating system requires numerous optical control devices, then each optical control device must have a window, with the arrangement of so many windows especially troublesome when the substrate is not of a simple shape. In such cases, optical fiber can be utilized instead of windows to serve as the light ray output and input medium. As indicated in FIG. 9, the sixth embodiment of the invention here consists of a first optical fiber 57 attached to the lower extremity of a mask plate 55 and a second optical fiber 51 disposed at a relative position on the opposite side of a substrate 53, with the end sections of the said two optical fibers 57 and 51 in an aligned arrangement; the monitoring light ray passes through one optical fiber, the substrate 53, and the other optical fiber to thereby control the thickness of the film 54. The second optical fiber 51 and the first optical fiber 57 can be routed into a first slender tube 52 and a second slender tube 56 to protect the optical fibers from deposition; the arrows 58 in the drawing indicate the average direction and dimensions of the coating molecules. In the embodiment herein, the substrate 53 can be movable or static in accordance with different vacuum coating system designs; the vapor source can be single, multiple, or a combination of different types and, furthermore, depending on the design of different vacuum coating systems, static or capable of three-dimensional movement or rotation to achieve optimal deposited film quality.

Since coating designs of extremely high precision require the direct control of the substrate, the substrate can be revolved on its own axis as deposition is executed. If the arrangement of the substrate and the vapor source is such that the film along the outer periphery of the revolving substrate is thicker, then a mask plate can be configured such that its form resembles the diaphragm of a camera and, as such, when the film reaches the required thickness, the aperture of the diaphragm-shaped mask plate is reduced at the masked section of the substrate and the optical control is moved to the unmasked section until the entire substrate is masked to thereby complete the coating of a film layer.

Figure 10:
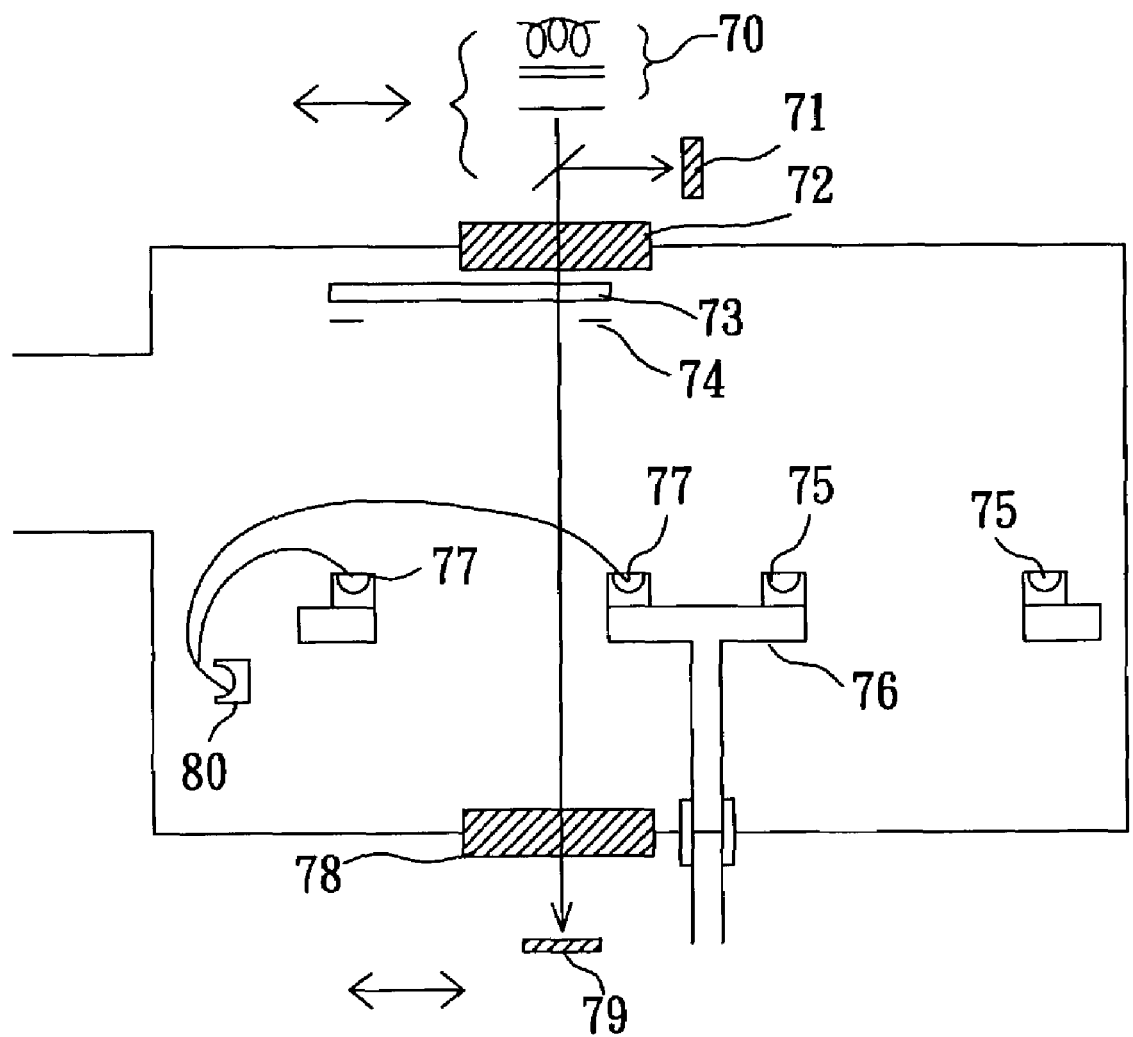
FIG. 10 is an orthographic drawing of the seventh embodiment of the invention herein.

Referring to FIG. 10, the seventh embodiment of the invention herein consists of a light source 70, a first detector 71 for reflected light ray, a window 72, a substrate 73 to be deposited, and a mask plate 74 structure formed like a camera diaphragm that masks the substrate 73 from the outside to the inside. To allow the film thickness to be extremely uniform at all times, the invention herein recommends the use of an annular vapor source. The annular vapor source can be vacant or non-vacant. As indicated in FIG. 10, a first crucible 77 of the electronic gun, with the electron emitter 80 of the electronic gun emitting electrons to the vacant, annular first crucible 77. A magnetic field can be utilized to control the electrons sweeping onto the vacant, annular first crucible 77 to produce a film having a thickness of optimal uniformity. Since a multiple layer optical film requires the utilization of a minimum of two materials, a vacant, annular second crucible 75 is shown in the drawing situated along with the vacant, annular first crucible 77 on the base plate 76 such that by controlling the rotation of the base plate 76 different coating materials can be selected. Since the vapor source shown in FIG. 10 is the electronic gun with the first and the second crucibles 77 and 75, the control light rays projected from the light source 70 pass by the vacant, annular first crucible 77 and through a window 78 to a second detector 79. The light rays are also reflected from the substrate 73 to the first detector 71. When the optical control detects that film has reached the required thickness, the diaphragmatic mask plate 74 reduces the masking of that particular zone of the substrate 73 and the light source 70, the first detector 71, and the second detector 79 components of the optical controller are moved to control over another zone where the required thickness has not been reached, until the diaphragmatic mask plate 74 has masked the entire substrate 73.

Furthermore, in the seventh embodiment of the invention herein shown in FIG. 10, when the substrate 73 has no mask plate whatsoever, the substrate 73 may be thinner at the center and thicker at the sides or possibly thicker at the center and thinner at the sides; if thinner at the center and thicker at the sides and, furthermore, the degree of thickness is not excessively large or inordinately small, then the said method can be utilized, with the utilization of a fixed-type mask plate to alter thickness also acceptable. Furthermore, if thicker at the center and thinner at the sides, then the fixed-type mask plate can be utilized to modify thickness uniformity such that it is thinner at the center and thicker at the sides and, furthermore, the change in thickness is gradual and the said method is utilized thereafter to execute coating process. Furthermore, a movable mask plate can be designed to mask the substrate from the inside to the outside and, as such, the movable mask plate must be installed at the center portion of the substrate.

Figure 11:
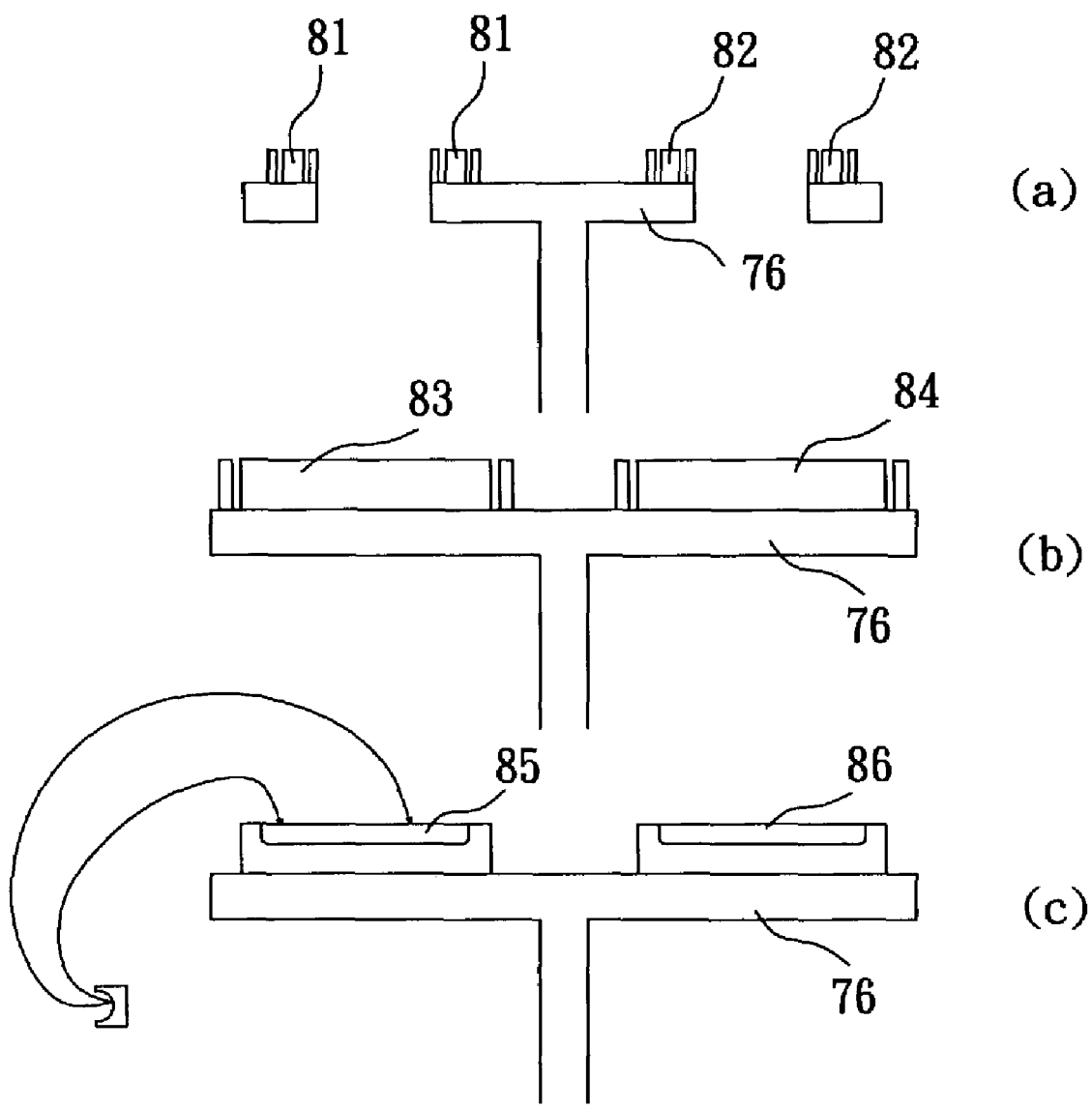
FIG. 11 is an orthographic drawing of the eighth embodiment of the invention herein.

Referring to FIG. 11, the eighth embodiment of the invention, includes the other three types of vapor sources that can also be utilized in the seventh embodiment of the invention, wherein (a) are vacant, sputtering targets 81 and 82, (b) are non-vacant, sputtering targets 83 and 84; and (c) are non-vacant electronic gun crucibles 85 and 86; the advantage of a vacant vapor source is the capability to simultaneously measure both the penetrating and reflected control light rays, though such acquisition is still difficult.

Figure 12:
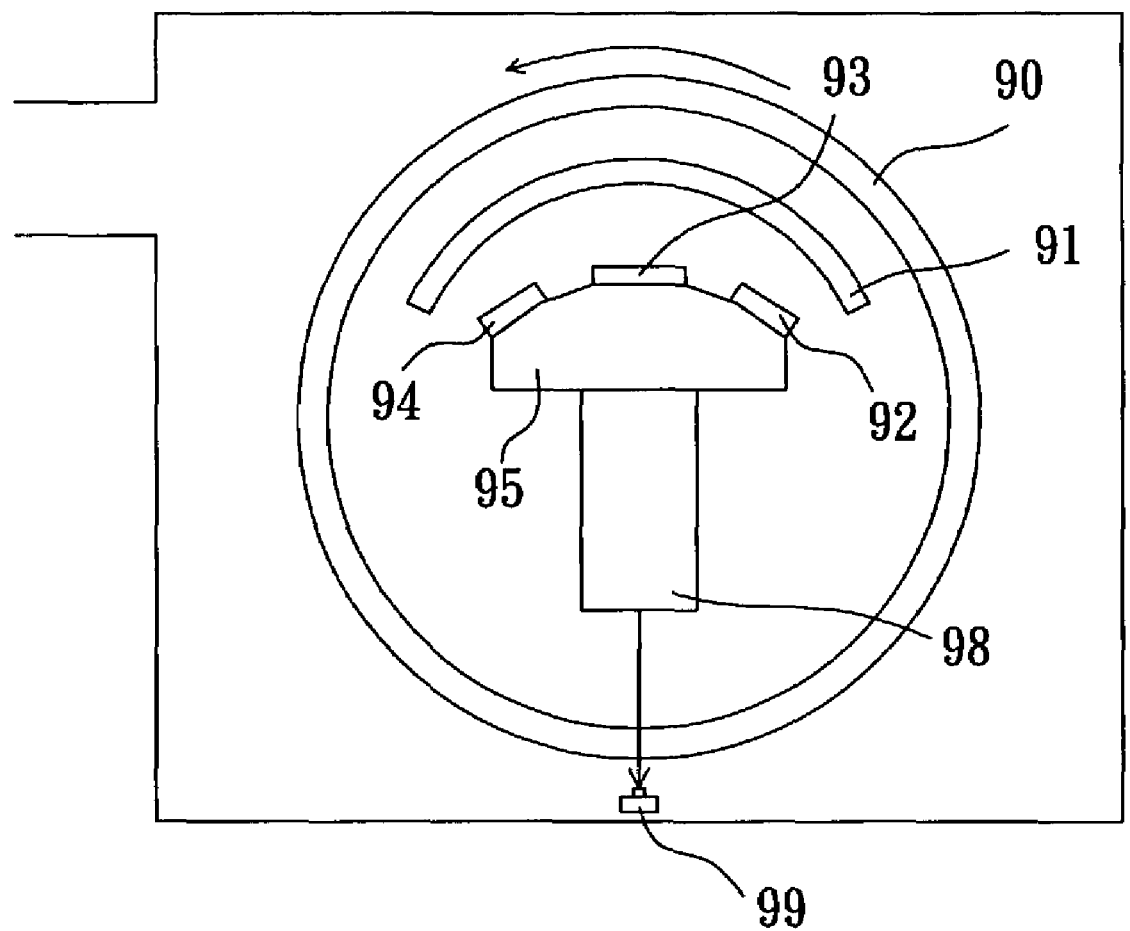
FIG. 12 is a cross-sectional drawing of the ninth embodiment of the invention herein.
Figure 13:
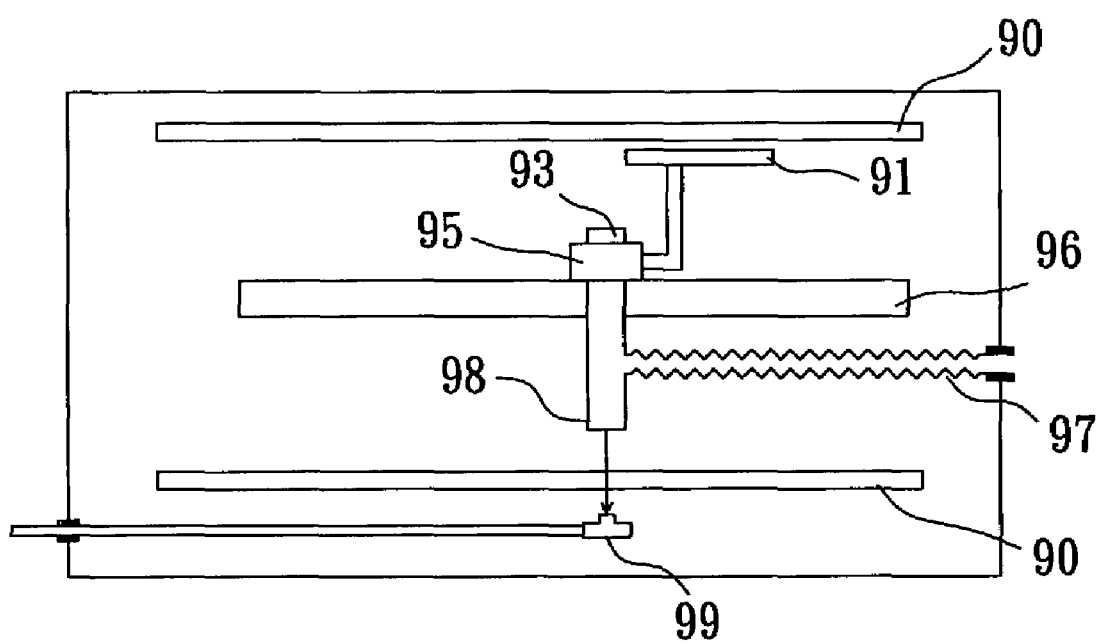
FIG. 13 is a cross-sectional drawing of the ninth embodiment of the invention herein, as viewed from another perspective.

If a substrate is cylindrical, approximately cylindrical, or has sections thereof, then the ninth embodiment design of the invention herein can be utilized; as indicated in FIG. 12 and FIG. 13, the substrate 90 is rotated on its center axis and different vapor sources 92, 93, and 94 are positioned on an anchoring mount 95. The anchoring mount 95 travels along a track 96 (as shown in FIG. 13). A metal bellows 97 extends to the vacuum system from the exterior section and its opposite extremity is connected to a light source 98 and the anchoring mount 95, with the water and electricity required by the vapor source supplied through the interior of the metal bellows. A mask plate 91 is situated between the substrate 90 and the vapor sources 92, 93, and 94. The light source 98 is positioned at the lower extent of the anchoring mount 95. The control light rays are projected pass the rotating substrate 90 to a detector (or an optical fiber) 99 and, when the detector 99 measures that the design objective thickness of the film has been reached, the entire anchoring mount 95 along with the mask plate 91, the vapor sources 92, 93, and 94 as well as the light source 98 are moved together towards the left, at which time the detector 99 is also moved leftward. This movement until the entire anchoring mount 95 has been moved to the extreme left of FIG. 13, which thereby completes the coating of the film layer.

Figure 14:
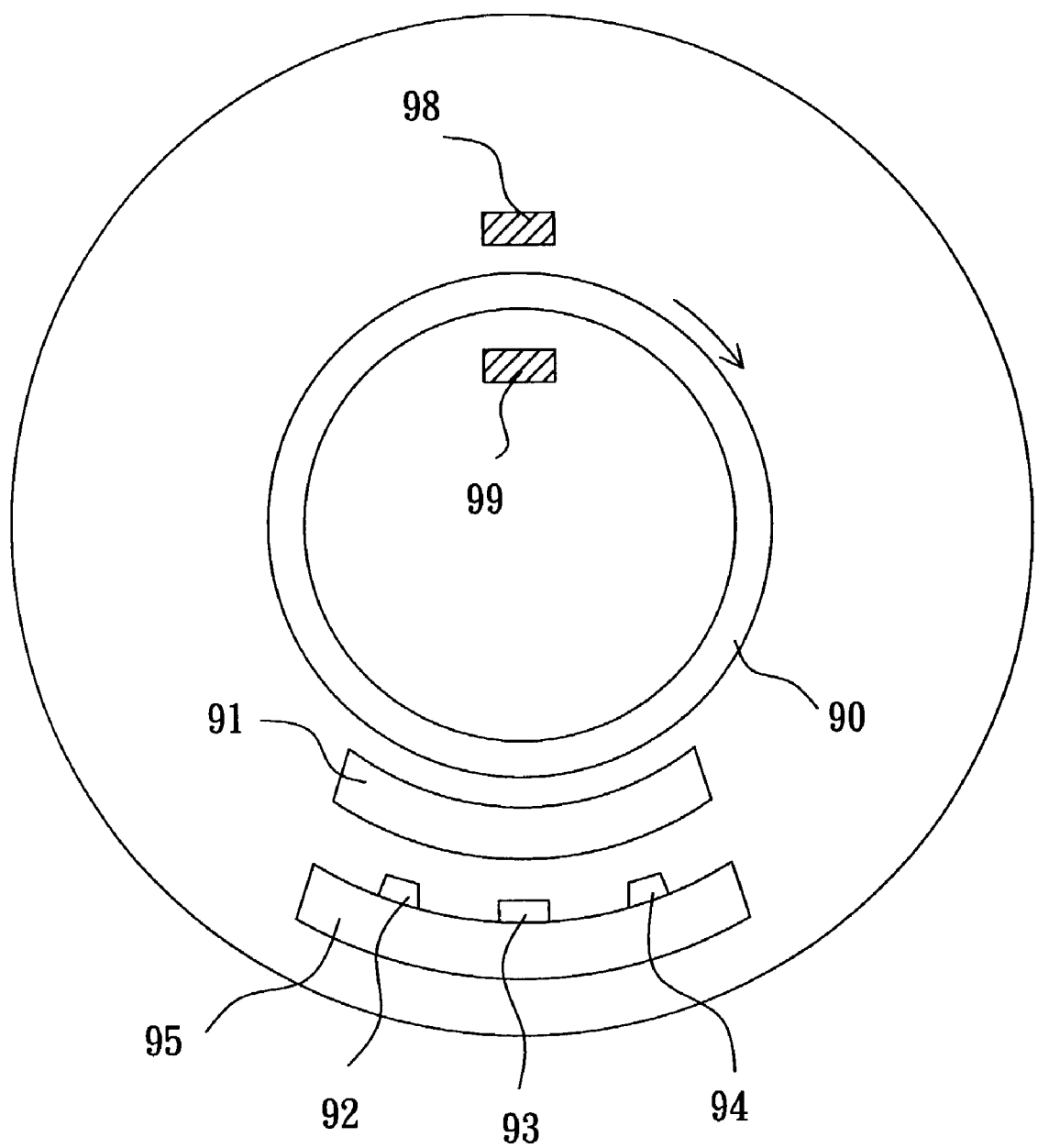
FIG. 14 is an orthographic drawing of the tenth embodiment of the invention herein.

Referring to FIG. 14, the tenth embodiment design of the invention herein executes coating control over the exterior surfaces of a substrate 90 that is cylindrical or approximately cylindrical as similarly provided for by the said ninth embodiment, wherein the said substrate 90 is rotated on its center axis, with a mask plate 91 and vapor sources 92, 93, and 94 situated along the outer side of the substrate 90; the vapor sources 92, 93, and 94 are positioned on an anchoring mount 95; the said film thickness control device consists of a light source 98 and a detector and/or optical fiber 99; the said light source 98 is disposed at the opposite side of the anchoring mount 95 and the said detector and/or optical fiber 99 is placed at the interior side the substrate 90 at a position that is aligned with the light source 98.

For the most general applications, the invention herein recommends that said various film thickness control methods be actually utilized in coating systems as follows:

Arrange one or more strip-shaped mask plates between the substrate and the vapor source, with the said mask plates arrayed in parallel; the parallel strip-shaped mask plates must be tightly flush against each other or sectionally overlaid to prevent coating material penetration through gaps between mask plates and deposition onto the substrate.

Utilize a mechanical arm or a clip structure to control displacement of the strip-shaped mask plates and thereby maintain a constant measured distance between the mask plates and the substrate.

Then, utilize a said film thickness control method or a combination of more than one film thickness control method to gradually move the strip-shaped mask plates to mask zones of film thickness and thereby achieve the design objective thickness, during which time the substrate can be movable or static.

When all sections required to be coated on the substrate have been masked, the coating of the particular layer of film is completed.

Figure 15:
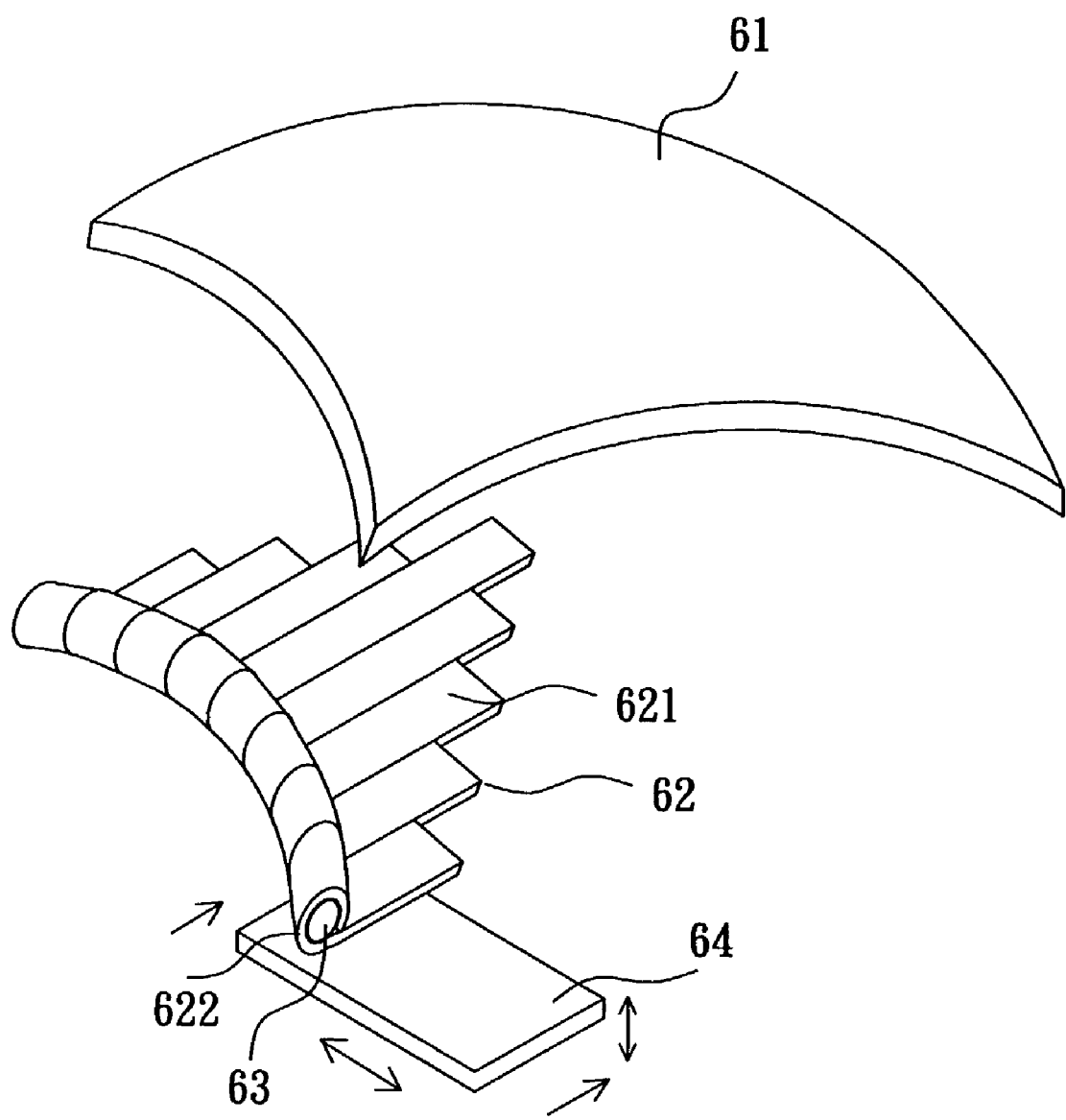
FIG. 15 is an exploded drawing of the mask plate embodiment of the invention herein.

Referring to FIG. 15, when a substrate 61 has a curved surface, a mask plate 62 having a contour that matches the said curved surface can be utilized, with the said mask plate 62 comprised of a plurality of strip-shaped plate elements 621 in a taut, flush configuration. A rolled opening 622 is formed at one end of the plurality of plate elements 621 to provide for the insertion of a pin 63, the shape of the said mask plate 62 thereby maintained by the insertion of the pin 63 through the plurality of plate elements 621 and, furthermore, the other extremities of the plate elements 621 are pivotable for adjusting the shape of the mask plate 62. Furthermore, there is a vapor source 64 that is capable of three-dimensional movement or rotation.

Figure 16:
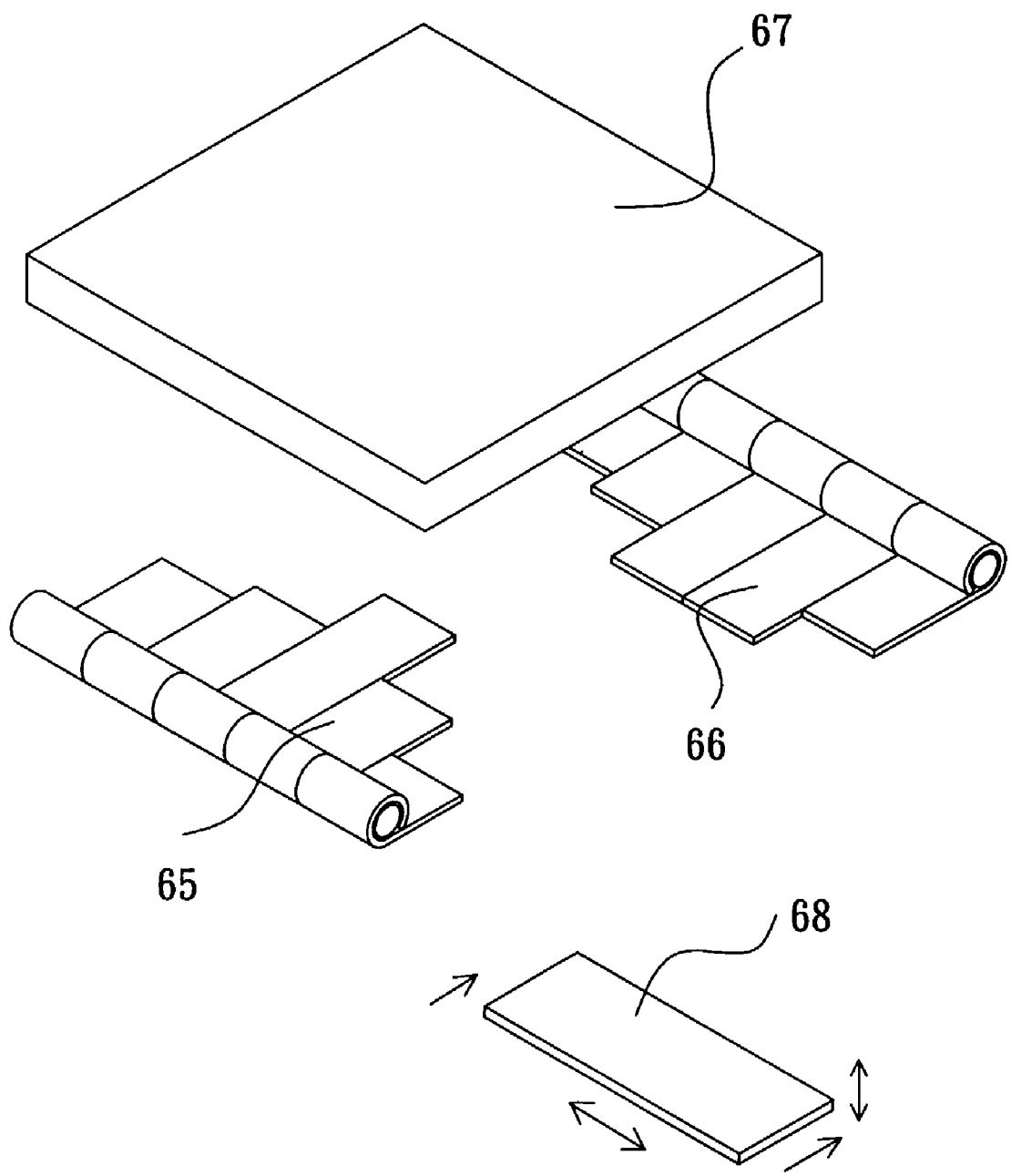
FIG. 16 is an isometric drawing of the assembled mask plate embodiment of the invention herein.

FIG. 16 illustrates an embodiment of the invention herein that utilizes two mask plates 65 and 66 in combination. The invention herein recommends that when the shape of a substrate 67 is more complex or the amount of coating material emitted from the vapor source in different direction is irregular, the two mask plates 65 and 66 can be utilized as a integrated dual film thickness control method, wherein one film thickness control is a quartz crystal control and the other film thickness control is an optical control or quartz crystal control, with the said vapor source 68 is capable of three-dimensional movement or rotation.

Figure 17:
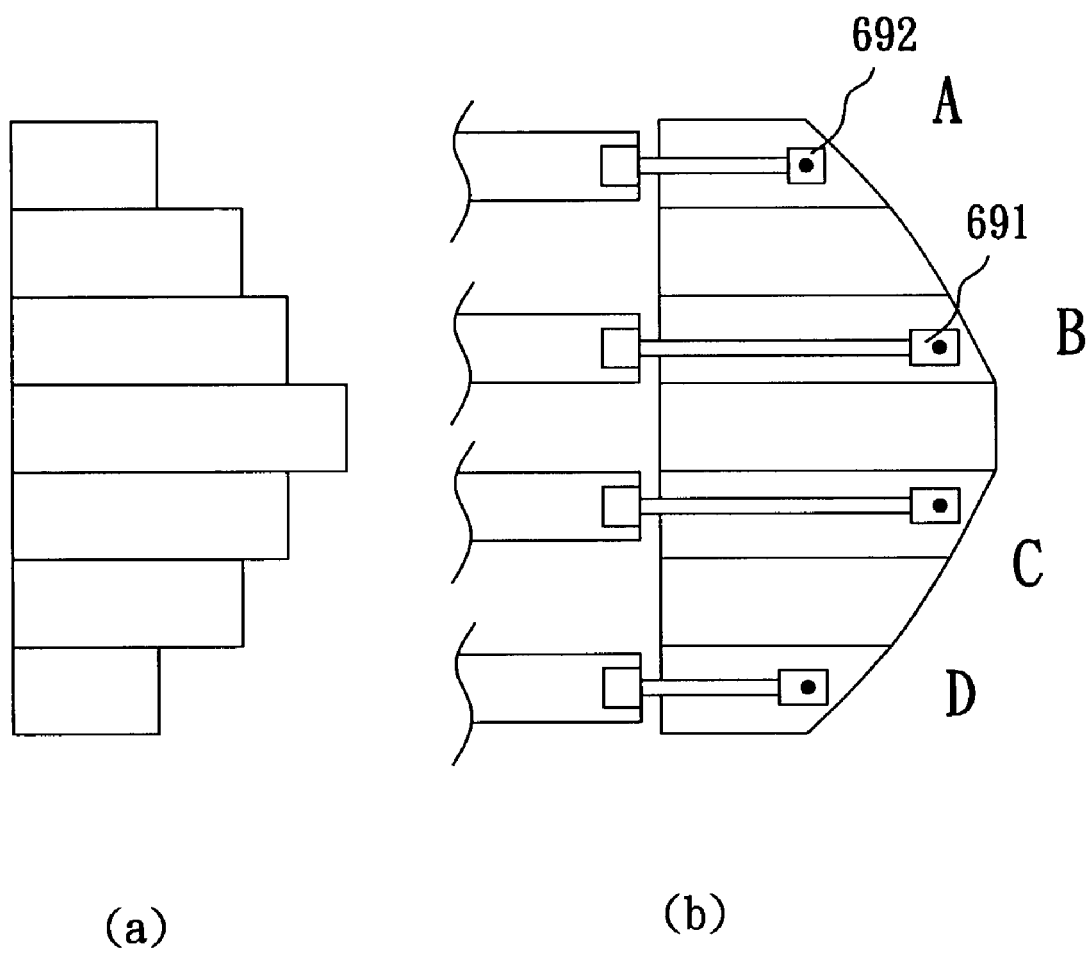
FIG. 17 is an orthographic drawing the adjustable mask plate embodiment of the invention herein.

The said mask plates fabricated of plate elements arrayed in parallel are all rectangular, as indicated in FIG. 15 and FIG. 16; as such, thickness errors are produced along the lateral lineal sections. Since film thickness deposition on the substrate is gradually attained, the shape of the mask plate in FIG. 17 (a) is modified to that in FIG. 17 (b), enabling the adjacent extents of the plate elements to become evenly contiguous to thereby reduce film thickness errors along the adjacent extents of the plate elements. Similarly, since film thickness is deposited gradually, the advance and withdrawal of the strip-shaped mask plates is also incremental and, therefore, a flexible line is arranged through the strip-shaped mask plates which involves the disposing of a thickness control and mechanical arm at key positions, as indicated in FIG. 17 (b), where a mechanical arm 691 or a clip structure 692 are placed at points A, B, C, and D. Furthermore, each mask plate does not require a respective control device, mechanical arm, or clip structure.

The said so-called substrate of large dimensions such as planar substrates or cylindrical surface substrates can be modified for expanded size plate placement fixtures and many small substrate can be arranged on the expanded size substrate placement fixtures, while also supporting the arrangement of appropriate film thickness control test pieces for these expanded size substrate placement fixtures. If a substrate requires an increase in temperature, then it is only necessary to utilize optical control. If a substrate does not require an increase in temperature, then some quartz crystal controls are arranged at appropriate positions on the substrate placement fixtures, with the high cycles of the quartz crystal controls wirelessly forwarded to the control circuit of the quartz crystal controls. The power supply of the quartz crystals are contained in a hermetically sealed box and since water cooling is quite difficult, they can only be utilized with substrates that do not require an increase in temperature. This method can even be utilized for the continuous, large-volume coating of small lenses and is of considerable assistance in mass production.

The said description only presents the technological content utilized by embodiments of the invention herein and all embellishments and modifications based on the invention herein by persons skilled in the relevant technology shall remain protected within the proposed patent claims of the present invention and, furthermore, the disclosed embodiments shall not be construed as a limitation thereof.

What is claimed is:

1. A dynamic film thickness control system providing control of a coated film thickness on a substrate comprising:

means to move a transparent substrate laterally from a first end towards a second end across a face of the mask plate and a vapor source wherein the mask plate is located between the substrate and the vapor source and the vapor source is disposed on a side of the mask plate closer to the first end so that a surface of the substrate currently undergoing deposition is exposed to the vapor source and after having deposited on it a predetermined thickness moves behind the mask;

a film thickness monitor to measure the thickness deposited on the substrate in real-time by projecting a light from a source from outside the coating vacuum system, through a first window on the vacuum system or through a first optical fiber, through the transparent substrate in the coating vacuum system, through the film being deposited through second window on the vacuum system or second optical fiber and on to the detector in the given order;

wherein, the movement of the substrate is controlled by the control system according to the thickness value determined by the said detector so that a surface area after acquiring a predetermined thickness moves behind the mask plate to allow successive surface areas of the substrate get exposed to the vapor source.

2. A dynamic film thickness control system according to claim 1, wherein the film thickness control device includes at least one second device selected from a group consisting of a second detector and a second optical fiber; the second device is located outside the first window wherein the second detector detects a reflection rate of light rays reflected from the substrate, and the second optical fiber is used as a light ray guide for detection purposes.

* * * * *